United States Patent
Suzuki et al.

(10) Patent No.: US 6,779,238 B2
(45) Date of Patent: Aug. 24, 2004

(54) METHOD OF MANUFACTURING PIEZOELECTRIC ACTUATOR

(75) Inventors: Makoto Suzuki, Chiba (JP); Akihiro Iino, Chiba (JP); Masao Kasuga, Chiba (JP); Keitarou Koroishi, Chiba (JP)

(73) Assignee: Seiko Instruments Inc., Chiba (JP)

( * ) Notice: Subject to any disclaimer, the term of this patent is extended or adjusted under 35 U.S.C. 154(b) by 186 days.

(21) Appl. No.: 09/802,615

(22) Filed: Mar. 9, 2001

(65) Prior Publication Data

US 2001/0029649 A1 Oct. 18, 2001

(30) Foreign Application Priority Data

Mar. 10, 2000 (JP) ........................................ 2000-067478

(51) Int. Cl.⁷ .............................................. H04R 17/00
(52) U.S. Cl. .......................... 29/25.35; 29/593; 29/417; 29/831; 29/842; 29/846
(58) Field of Search ............................... 29/25.35, 412, 29/417, 593, 846, 831, 842; 310/323.04, 333.08

(56) References Cited

U.S. PATENT DOCUMENTS

| | | | |
|---|---|---|---|
| 5,172,023 A | * 12/1992 | Kawai | 310/323 |
| 5,241,236 A | * 8/1993 | Sasaki | 310/358 |
| 5,369,862 A | * 12/1994 | Kotani | 29/25.35 |
| 5,494,543 A | 2/1996 | Okano et al. | 216/33 |
| 5,758,396 A | * 6/1998 | Jeon | 29/25.35 |
| 5,923,352 A | * 7/1999 | Kikuchi | 347/70 |
| 6,046,526 A | * 4/2000 | Maruyama | 310/323.06 |
| 6,145,177 A | * 11/2000 | Fujimoto | 29/25.35 |
| 6,158,098 A | * 12/2000 | Okeshi | 29/25.35 |

FOREIGN PATENT DOCUMENTS

| | | |
|---|---|---|
| JP | 63-290175 | 11/1988 |
| JP | 05-284760 | 10/1993 |
| JP | 07-163166 | 6/1995 |

* cited by examiner

Primary Examiner—Carl J. Arbes
Assistant Examiner—Tai Nguyen
(74) Attorney, Agent, or Firm—Adams & Wilks

(57) ABSTRACT

In a method of manufacturing a piezoelectric actuator there are provided a piece of piezoelectric material having piezoelectric bodies, a first piece of material having vibrational bodies, a second piece of material having movable bodies, and a third piece of material having pressurizing members. The first, second and third pieces of materials are superimposed over the piece of piezoelectric material to form a multilayered structure having piezoelectric actuators. The multilayered structure is cut to separate each of the piezoelectric actuators from one another.

15 Claims, 14 Drawing Sheets

METHOD OF MANUFACTURING PIEZOELECTRIC ACTUATOR

BACKGROUND OF THE INVENTION

1. Field of the Invention

The present invention relates to a method of manufacturing a piezoelectric actuator.

2. Description of the Related Art

Conventionally, in a method of manufacturing individual piezoelectric actuators, a piezoelectric material is divided into various pieces each having a predetermined size, and then various such as a poling process and connection of various parts are performed for each piezoelectric piece of material.

Moreover, during miniaturization of the piezoelectric actuator, each structural part of the piezoelectric actuator is also miniaturized. Thus, in the conventional manufacturing method, it is difficult to treat miniaturized parts. Furthermore, since assembly of the piezoelectric actuator takes a long time, production efficiency becomes low and a manufacturing cost becomes high.

Further, since products of the piezoelectric actuators are packed individually, a manufacturing cost becomes high and unpacking of the package when it arrives at is destination is time consuming.

Furthermore, since the piezoelectric actuators are examined individually during quality examination before shipment, a time required for the examination becomes long.

SUMMARY OF THE INVENTION

An object of the present invention is to provide a method of manufacturing a piezoelectric actuator which has high production efficiency and is available to miniaturize the piezoelectric actuator. Also, an object of the present invention is to simply pack the piezoelectric actuator and to easily perform a quality examination before shipment.

To solve the above problems, there is provided a method of manufacturing a piezoelectric actuator characterized by including the steps of joining parts except for piezoelectric bodies to a piezoelectric material having a size that a plurality of piezoelectric actuators can be formed, so as to form the plurality of piezoelectric actuators, forming the piezoelectric material with a predetermined poling structure, and then dividing the piezoelectric material to form the plurality of piezoelectric actuators.

Here, joinings of the parts except for the piezoelectric bodies are performed by, for example, a step of forming electrodes having predetermined shapes on both surfaces of a piezoelectric material having a size that a plurality of piezoelectric actuators can be formed, a step of joining vibrating bodies to the piezoelectric material, a step of setting moving bodies so as to be actuated by vibration transmitted from the vibrating bodies, and a step of setting pressuring means for pressuring the moving bodies toward the vibrating bodies. After these steps are performed and the piezoelectric material is formed with a predetermined poling structure, the piezoelectric material is divided to manufacture the plurality of piezoelectric actuators.

Therefore, in comparison with a conventional method of manufacturing a piezoelectric actuator by performing various processings and joinings of various parts for each of the piezoelectric bodies divided, the number of steps can be greatly decreased. As a result, production efficiency is improved and a manufacturing cost can be decreased.

Also, a part sheet including a plurality of identical parts in predetermined positions is layered on the piezoelectric material to join at least one kind of the parts. As a result, the number of steps can be further decreased and miniaturization of each of the piezoelectric actuators can be sufficiently applied.

Also, after the step of joining the parts except for the piezoelectric bodies to the piezoelectric material so as to form the plurality of piezoelectric actuators and the step of poling the piezoelectric material are performed, the piezoelectric material may be transported to a place where the piezoelectric actuator is to be used, and divided into the plurality of piezoelectric actuators to use them in the place.

Therefore, since the plurality of piezoelectric actuators before the dividing are packed together, packing can be simplified and a manufacturing cost can be decreased. Also, a quality examination before shipment becomes easy.

BRIEF DESCRIPTION OF THE DRAWINGS

In the accompanying drawings;

FIG. 5A is a plane view and FIG. 5B is a cross-sectional view taken along line 5B–5B' in FIG. 5A;

FIG. 7A is a plane view and FIG. 7B is a view taken along line 7B–7B' in FIG. 7A;

DETAILED DESCRIPTION OF THE PREFERRED EMBODIMENT

Hereinafter, an embodiment of the present invention will be described in detail with reference to the accompanying drawings.

Now, a structure of a piezoelectric actuator 1 manufactured by a manufacturing method of the present invention will be described.

Figure 1:
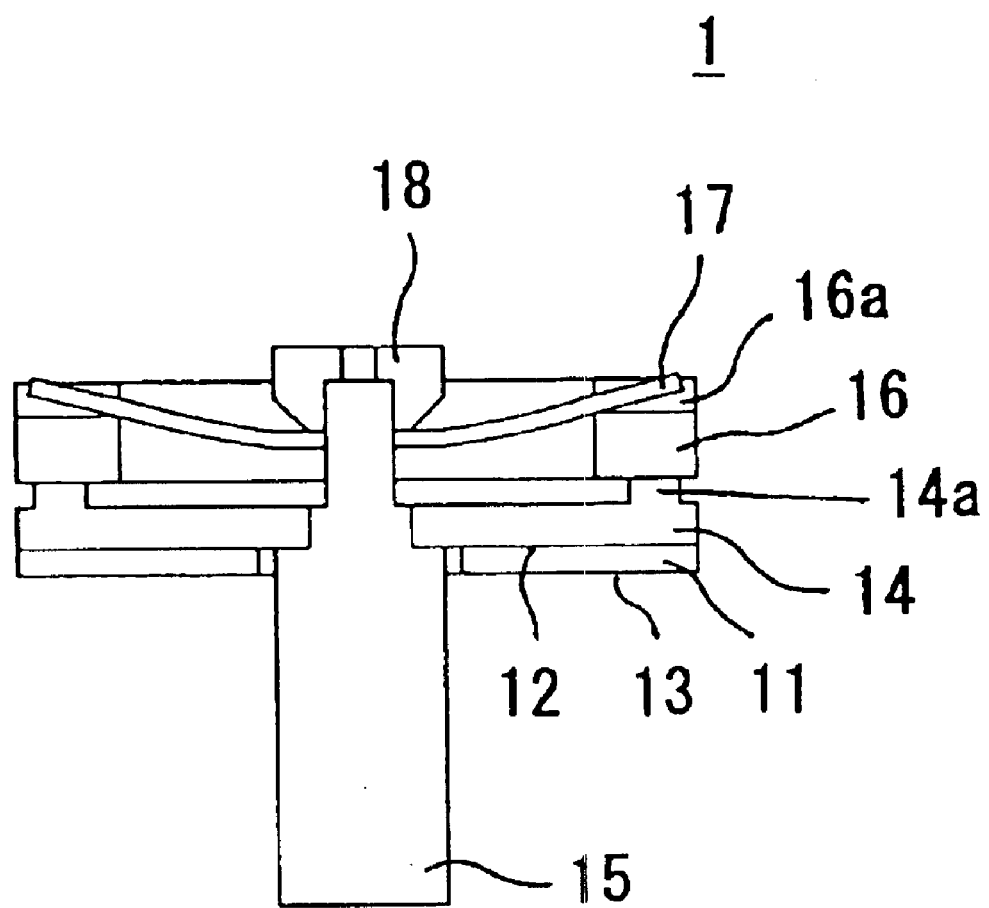
FIG. 1 is a cross sectional view of a piezoelectric actuator 1 manufactured by a manufacturing method of the present invention.

FIG. 1 is a cross sectional view of the piezoelectric actuator 1 manufactured by the manufacturing method of the present invention. In FIG. 1, the piezoelectric actuator 1 is constructed of a piezoelectric body 11, a vibrating body 14 which is joined on an upper surface of the piezoelectric body 11, a plurality of protrusions 14a which are integrally provided on an upper surface of the vibrating body 14, a supporting part 15 which is passed through the centers of the piezoelectric body 11 and the vibrating body 14, a moving body 16 which is disposed to contact against the protrusions 14a, a pressuring mechanism 17 whose a tip narrow portion (mentioned below) is fit to a groove portion 16a of the moving body 16, which has functions for positioning the moving body 16 and supporting the supporting part 15 with rotation, and which presses the moving body 16 to the protrusions 14a, and a holding part 18 for adjusting a pressure applied to the pressuring mechanism 17 and capping a tip of the supporting part 15.

Next, the method of manufacturing the piezoelectric actuator will be described.

In the manufacturing method according to the present invention, although the details are mentioned below, a plurality of identical parts constituting the piezoelectric actuator 1 are formed as part sheets disposed on one surface. Also, a piezoelectric material sheet formed with a predetermined shape is performed with various processings such as poling processing, and each of the part sheets is joined onto the piezoelectric material sheet. Thus, the resultant piezoelectric material sheet with a plurality of piezoelectric actuators is manufactured, and then divided into each piezoelectric actuator 1.

First, structures of the piezoelectric material sheet and the various part sheets, which are prepared to manufacture the piezoelectric actuators, will be described simply.

Figure 2:
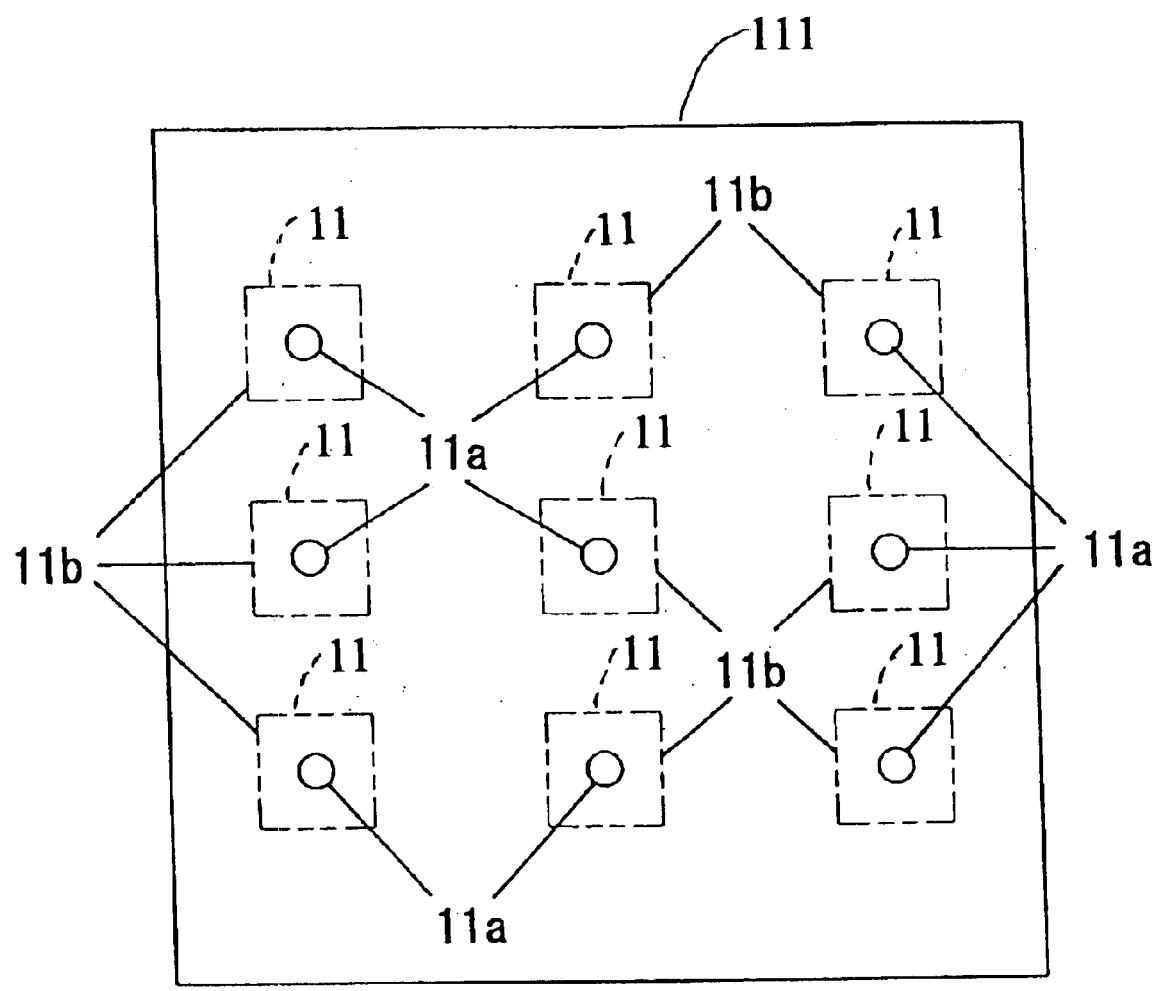
FIG. 2 is a plane view showing a piezoelectric material sheet formed with a shape.

A piezoelectric material sheet 111 shown in FIG. 2 is formed with a size and a form such that nine piezoelectric actuators 1 can be formed. That is, the piezoelectric material sheet 111 has a size such that nine piezoelectric bodies 11 can be taken. Each of holes 11a into which the supporting part mentioned below is inserted is formed with penetration in the center of each of regions 11b as the piezoelectric bodies 11.

Figure 3:
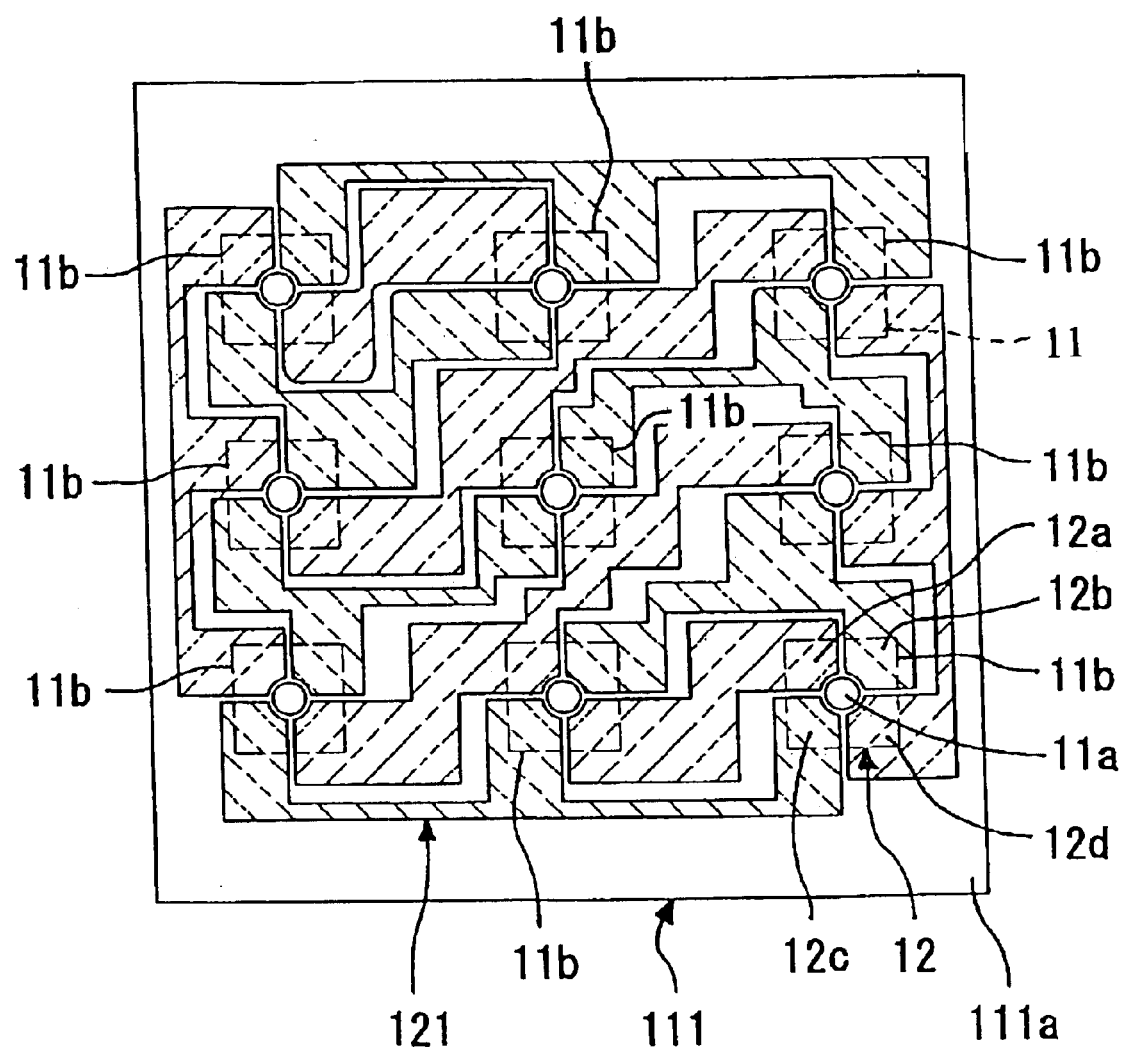
FIG. 3 shows a dividing electrode pattern formed on one surface of the piezoelectric material sheet shown in FIG. 2.

As shown in FIG. 3, a dividing electrode pattern 121 is formed on one surface 111a of the piezoelectric material sheet 111. Each of dividing electrode patterns 12 including electrode patterns 12a to 12d is formed on one surface of each of the piezoelectric bodies 11.

Figure 4:
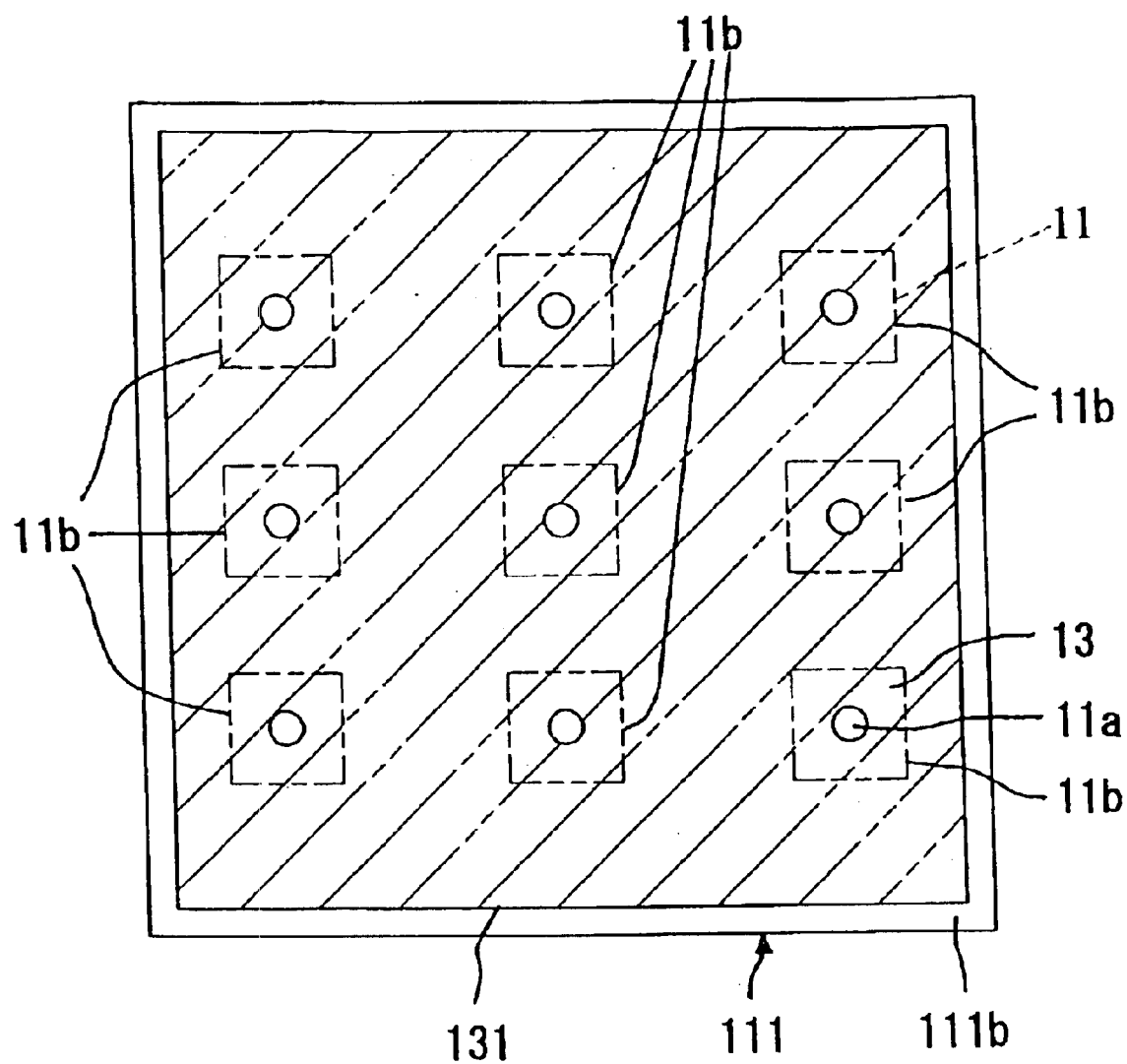
FIG. 4 shows an entire surface electrode pattern formed on the other surface of the piezoelectric material sheet shown in FIG. 2.

Also, as shown in FIG. 4, an entire surface electrode pattern 131 is formed on the other surface 111b of the piezoelectric material sheet 111. Thus, each of entire surface electrode patterns 13 is formed on the other surface of each of the piezoelectric bodies 11.

Here, a process such as sputtering or a sol-gel method is used to form the dividing electrode pattern 121 and the entire surface electrode pattern 131. The electrode patterns 121 and 131 can be also formed simultaneously.

Figure 5A:
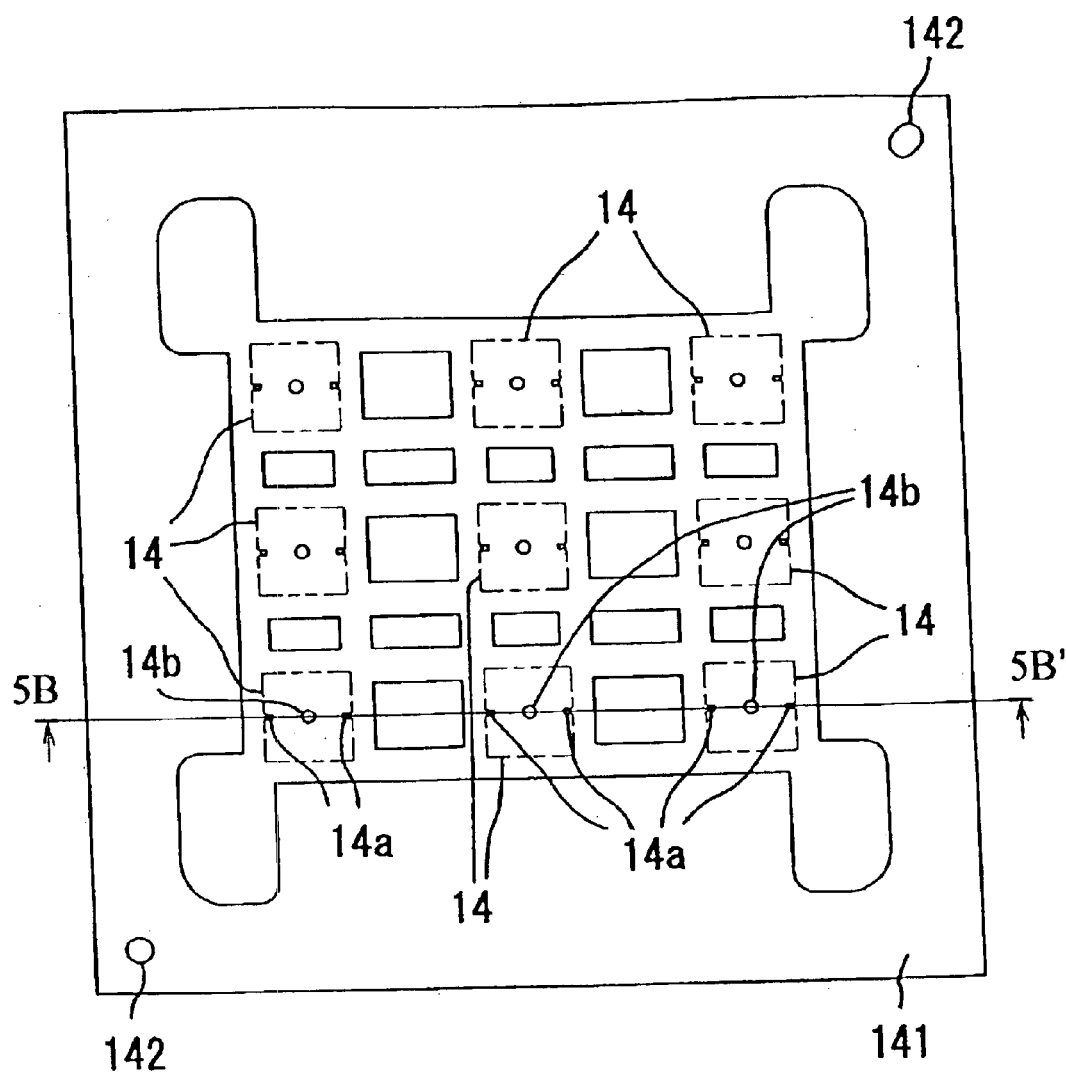
FIGS. 5A and 5B show a vibrating body sheet, where
Figure 5B:
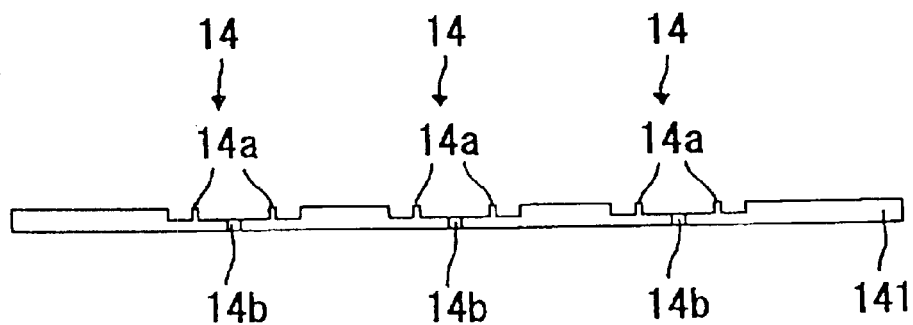

A vibrating body sheet 141 shown in FIGS. 5A and 5B has nine vibrating bodies 14. A position of each of the vibrating bodies 14 corresponds to a position of each of the piezoelectric bodies 11 of the piezoelectric material sheet 111. Each of holes 14b into which the supporting part 15 mentioned below is inserted is formed with penetration in the center of each of the vibrating bodies 14. In each of the vibrating bodies 14, two protrusions 14a are formed in symmetric positions sandwiching the hole 14b. Although the protrusions 14a are formed by depressing a portion around the protrusions 14a with cutting (see FIG. 5B), further in order to decrease a load applied in dividing mentioned below, a region around the portion is depressed with cutting.

Figure 6A:
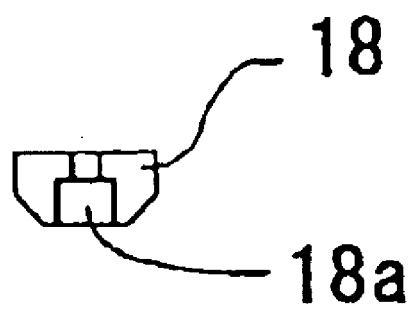
FIGS. 6A and 6B show a supporting part and a holding part joined into a tip of the supporting part.
Figure 6B:
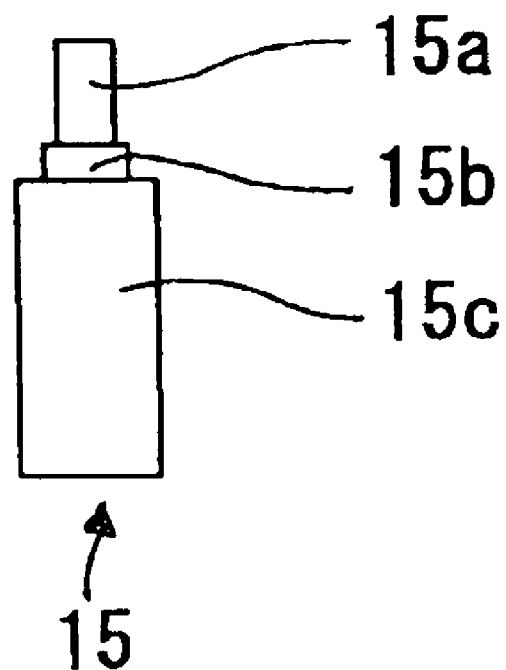

The supporting part 15 shown in FIG. 6B is constructed of three cylindrical portions 15a, 15b and 15c with different cross section areas. Here, the outside diameter of the cylindrical portion 15a is set to approximately equal to the diameter of a hole 17b of the pressuring mechanism 17 mentioned below. The outside diameter of the cylindrical portion 15b is set to approximately equal to the diameter of the hole 14a of the vibrating body 14. The outside diameter of the cylindrical portion 15c is set to approximately equal to the diameter of the hole 11a of the piezoelectric body 11.

Figure 10:
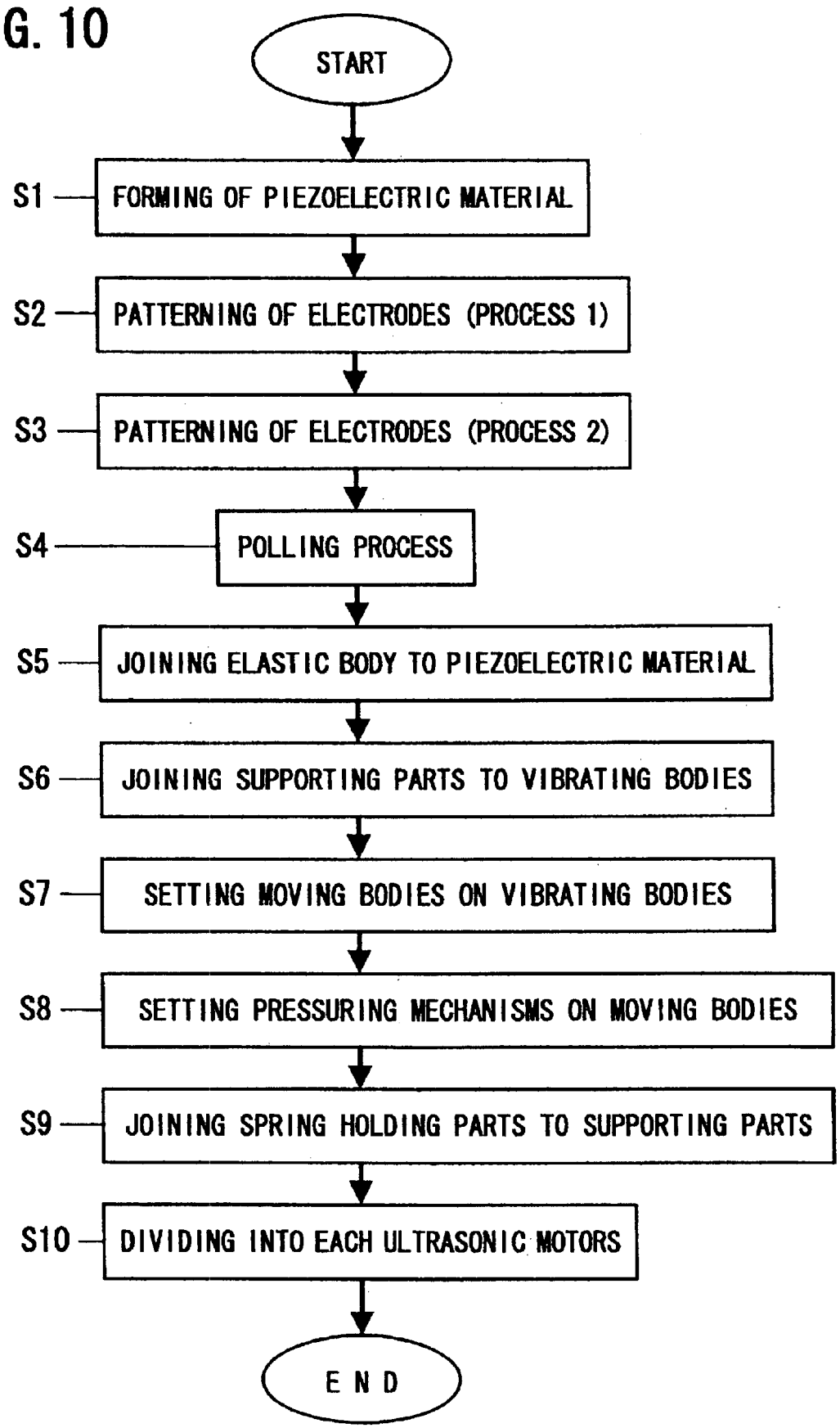
FIG. 10 is an explanatory diagram of steps in the method of manufacturing the piezoelectric actuator, to which the present invention is applied.
Figure 11:
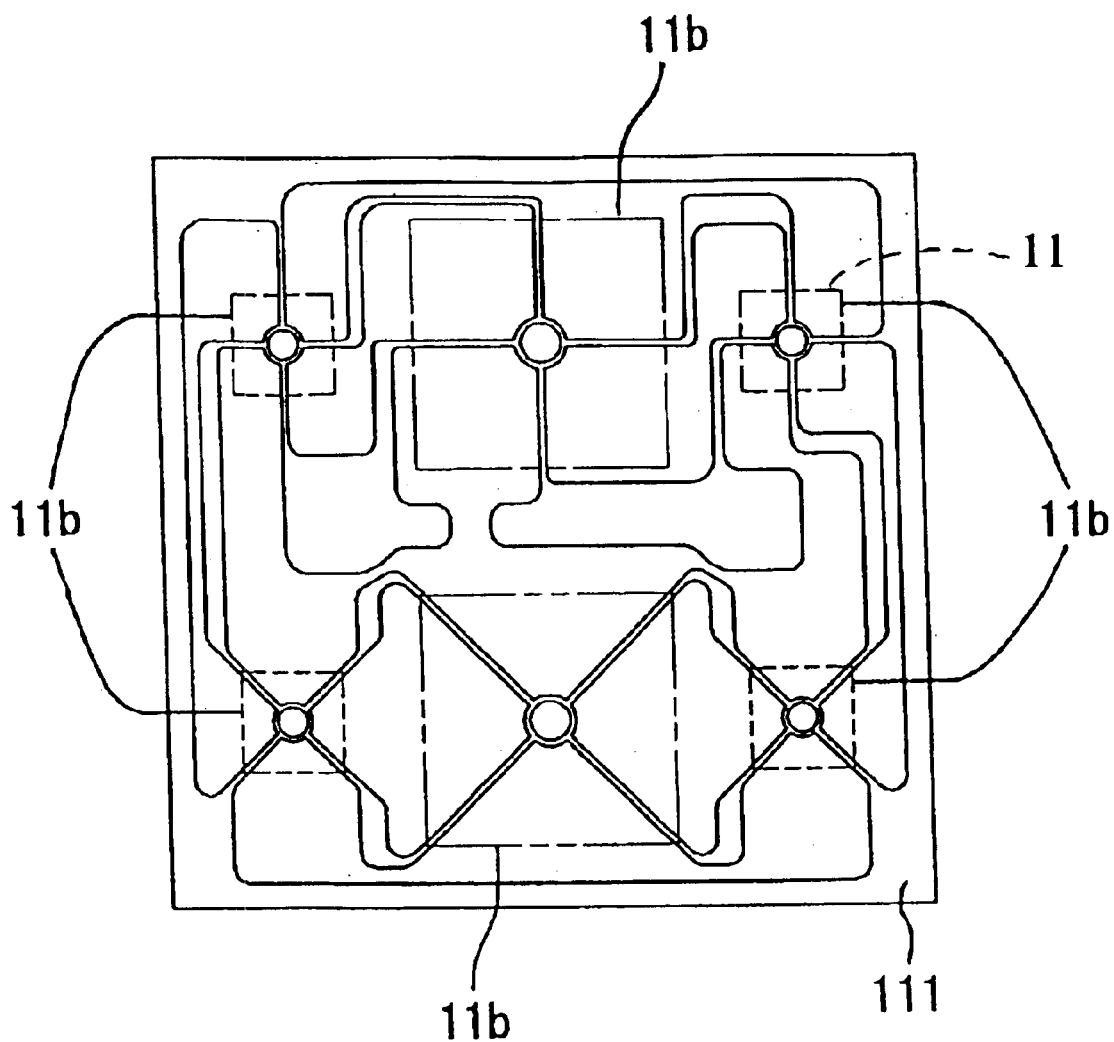
FIG. 11 shows a modification example of the piezoelectric material sheet.

Also, the holding part 18 shown in FIG. 6A is joined by fitting a concave portion 18a into a tip of the cylindrical portion 15a of the supporting part 15 in step S9 mentioned below (see FIG. 10).

Figure 7A:
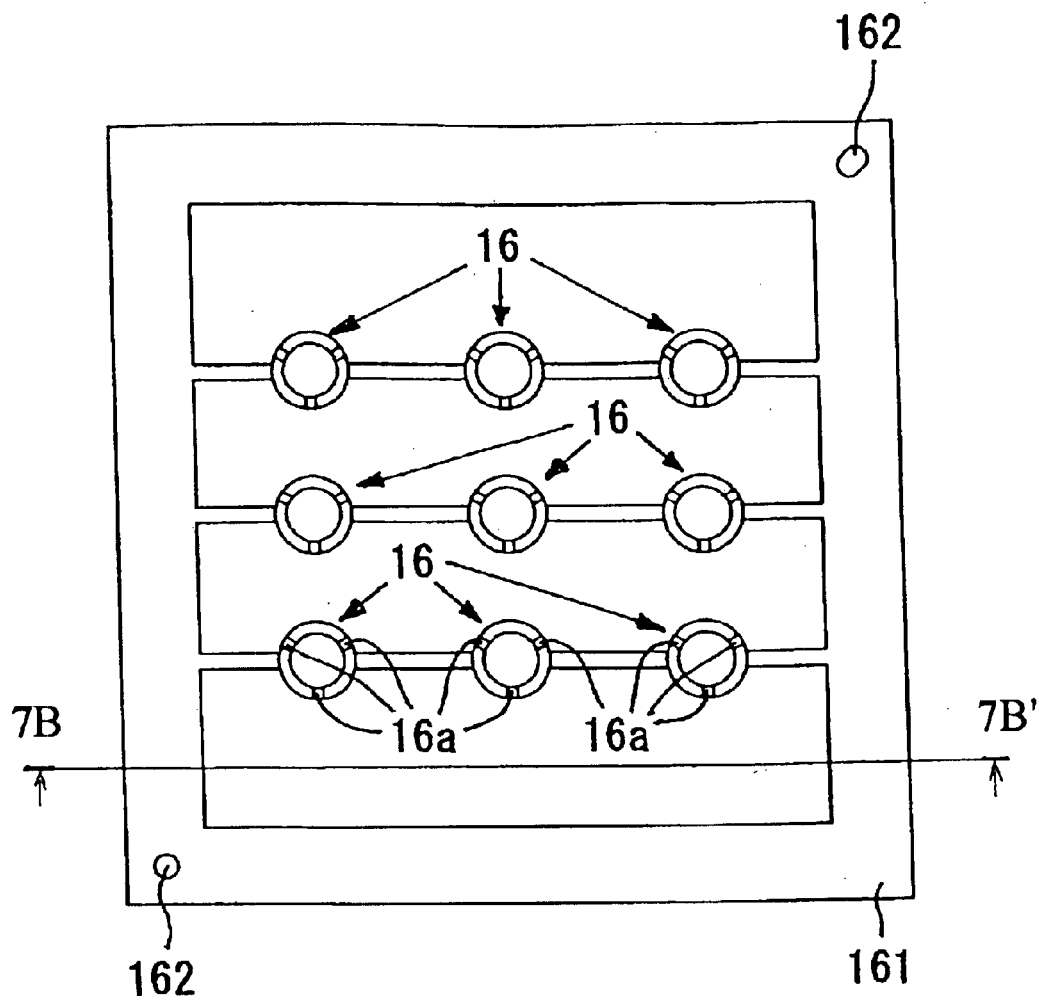
FIGS. 7A and 7B show a moving body sheet, where
Figure 7B:
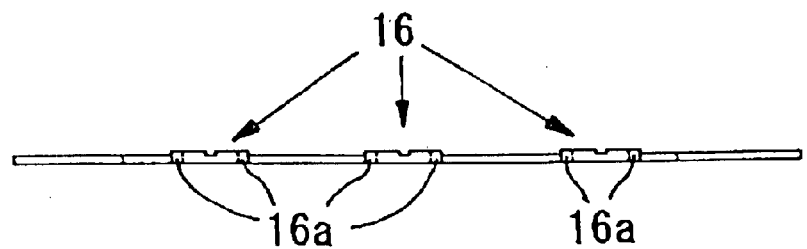

A moving body sheet 161 shown in FIGS. 7A and 7B has nine moving bodies 16. A position of each of the moving bodies 16 corresponds to a position of each of the piezoelectric bodies 11 of the piezoelectric material sheet 111. The three groove portions 16a are formed in each of the moving bodies 16 at regular intervals by a method such as etching or cutting.

Figure 8:
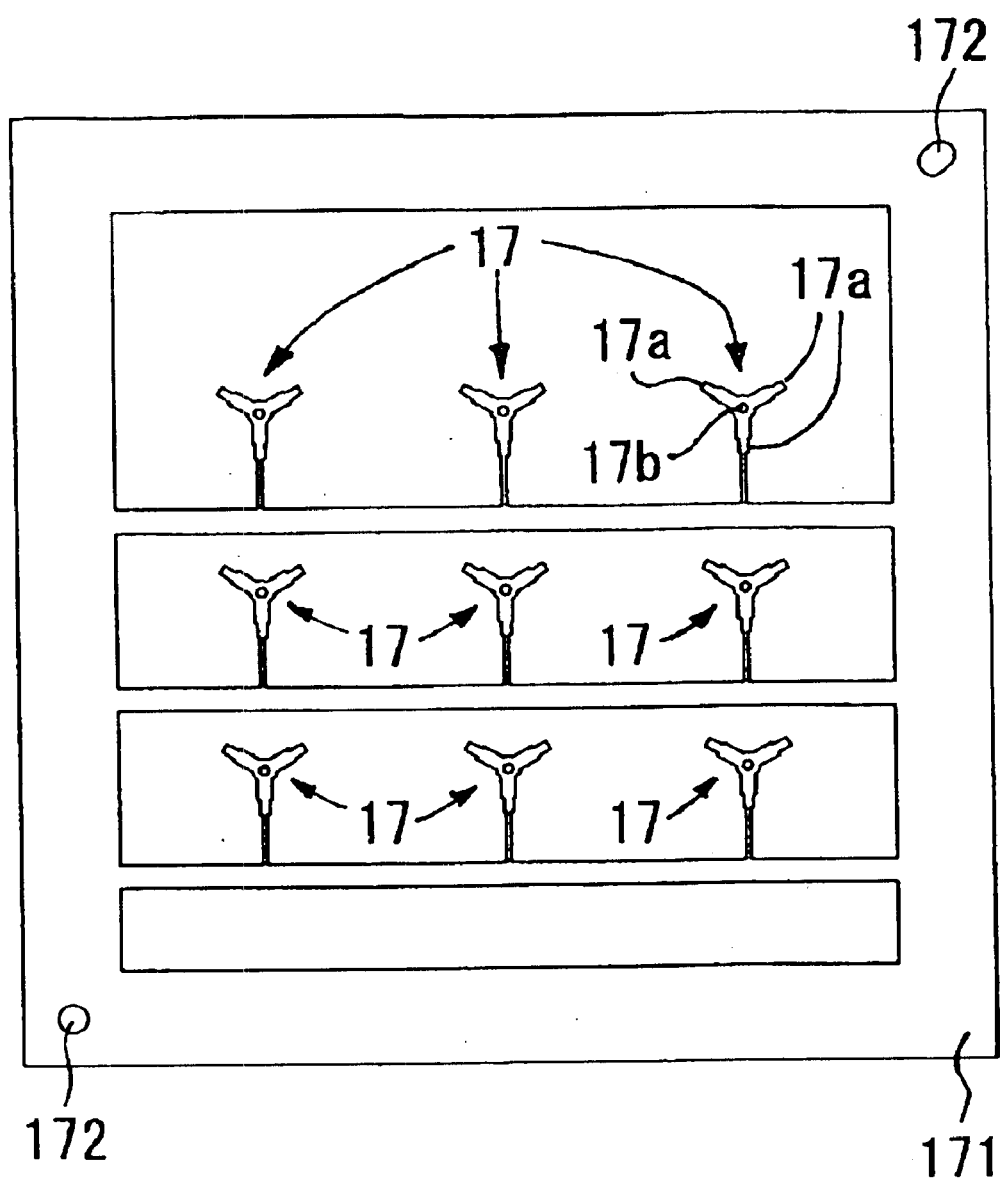
FIG. 8 shows a pressuring mechanism sheet.

A pressuring mechanism sheet 171 shown in FIG. 8 has nine pressuring mechanisms 17. A position of each of the pressuring mechanisms 17 corresponds to a position of each of the piezoelectric bodies 11 of the piezoelectric material sheet 111. Three tip narrow portions 17a which are fit into the groove portions 16a of each of the moving bodies 16 are formed in each of the pressuring mechanisms 17. Each of the holes 17b into which the supporting part 15 is inserted is formed in the center of each of the pressuring mechanisms 17.

Also, shafts provided in a jig (not shown) for assembly are inserted into holes 142, 162 and 172 which are formed in the vibrating body sheet 141, the moving body sheet 161 and the pressuring mechanism sheet 171, respectively. Each part sheet is assembled on the jig.

Figure 9A:
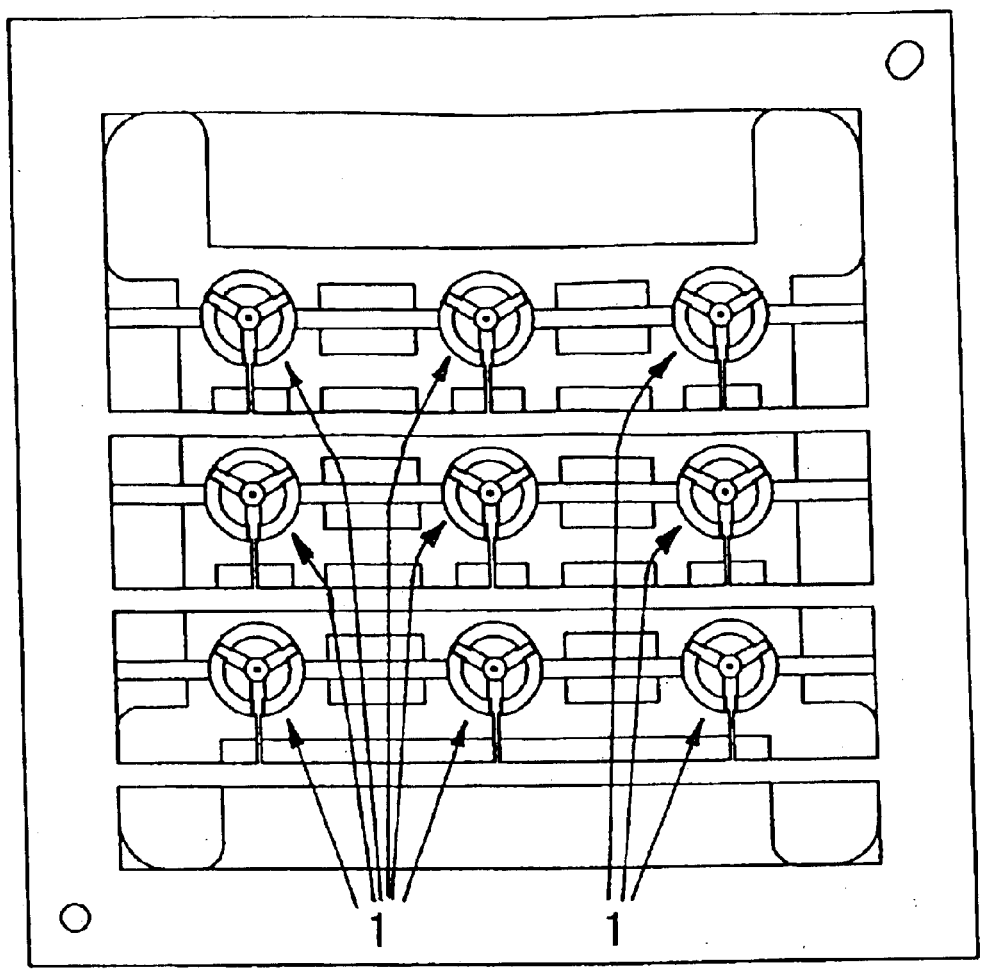
FIGS. 9A and 9B show a plurality of piezoelectric actuators formed on the piezoelectric material sheet before dividing.
Figure 9B:
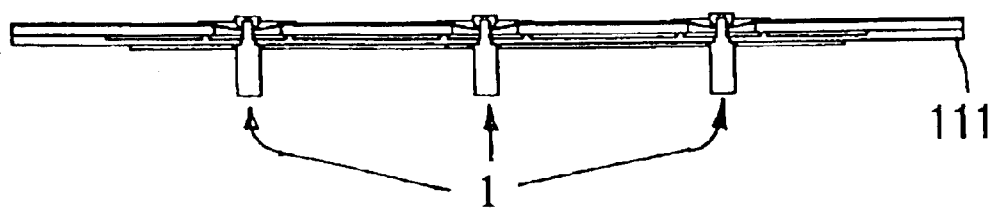

The above part sheets are joined onto the piezoelectric material sheet 111 in accordance with a flowchart of FIG. 10 mentioned below to simultaneously manufacture nine piezoelectric actuators 1 as shown in FIGS. 9A and 9B.

First, a piezoelectric material is processed to obtain the piezoelectric material sheet 111 with a predetermined shape (step S1).

Next, the dividing electrode pattern 121 is formed on the surface 111a of the piezoelectric material sheet 111 (step S2), and the entire surface electrode pattern 131 is formed on the other surface 111b of the piezoelectric material sheet 111 (step S3).

Here, steps S2 and S3 may be performed simultaneously, or the electrode patterns 121 and 131 may be formed in the order reverse to the above.

Then, a predetermined voltage is applied to the electrode patterns 121 and 131 formed on both surfaces of the piezoelectric material sheet 111 to form the piezoelectric material sheet 111 (piezoelectric bodies 11) with a predetermined poling structure (step S4).

Next, the piezoelectric material sheet 111 is joined to the vibrating body sheet 141 such that the holes 11a and 14b formed in each part sheet are overlapped each other (step S5).

Then, the supporting parts 15 are joined to the piezoelectric material sheet 111 and the vibrating body sheet 141, which are joined to each other (step S6).

In this joining, the supporting parts 15 are inserted into the holes 11a of the piezoelectric material sheet 111 and the holes 14b of the moving body sheet 141 from the side of the other surface 111b of the piezoelectric material sheet 111. Note that, since the inside diameter of each of the holes 14b is smaller than the outside diameter of the cylindrical portion 15c of each of the supporting parts 15, the supporting parts 15 do not penetrate the vibrating body sheet 141.

Next, the moving body sheet 161 is set on the vibrating body sheet 141 such that the moving bodies 16 contact the protrusions 14a of the vibrating bodies 14 (step S7).

Then, the tip narrow portions 17a of the pressuring mechanisms 17 are fit to the groove portions 16a of the moving bodies 16 to set the pressuring mechanism sheet 171 onto the moving body sheet 161 (step S8). Here, fitting of the tip narrow portions 17a to the groove portions 16a combines with inter-alignment.

Further, with a state that the pressuring mechanisms 17 are warped and pressured such that the moving bodies 16 are pushed to the protrusions 14a with a predetermined pressure, the holding parts 18 are joined onto the supporting parts 15 (step S9).

Next, the piezoelectric: material sheet 111 is divided by dicing, blanking or the like, or by processing with an excimer laser (step S10), so that nine piezoelectric actuators 1 shown in FIG. 1 are manufactured simultaneously.

As mentioned above, various processings and joinings (settings) of various parts are performed for the piezoelectric material sheet 111 (steps S2 to S9), and the resultant piezoelectric material sheet 111 is divided (step S10) to manufacture the plurality of piezoelectric actuators 1. Thus, the number of steps can be greatly decreased in comparison with a conventional method of manufacturing a piezoelectric actuator 1 by performing various processings and joinings of various parts for each of the piezoelectric bodies 11 divided. As a result, production efficiency is improved and a manufacturing cost can be decreased.

Also, even if parts are miniaturized, since joining of the parts is performed in part sheet unit, this joining is easier than that of a single part as the conventional method, so that working efficiency is improved.

Figure 12:
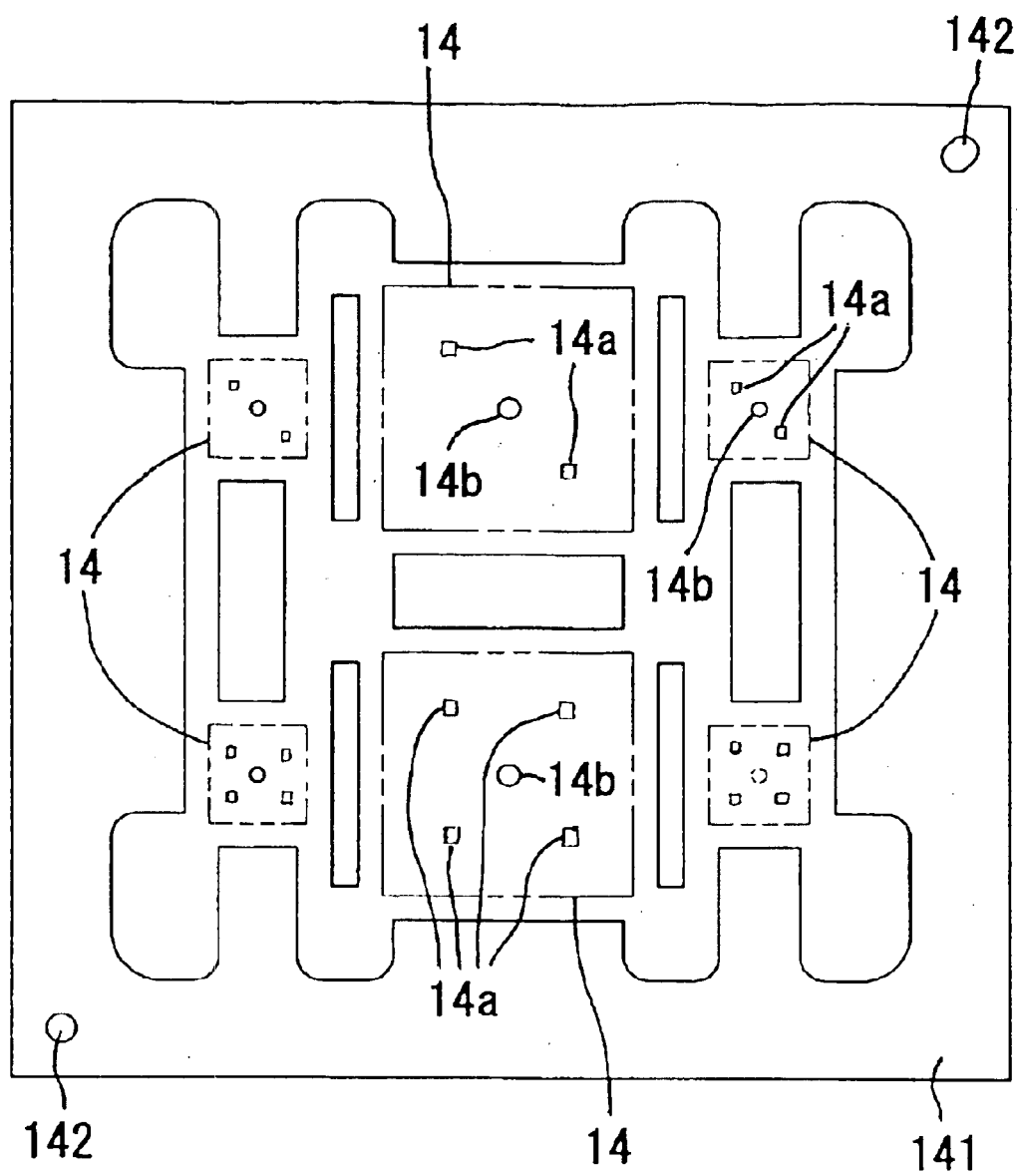
FIG. 12 shows a modification example of the vibrating body sheet.
Figure 13:
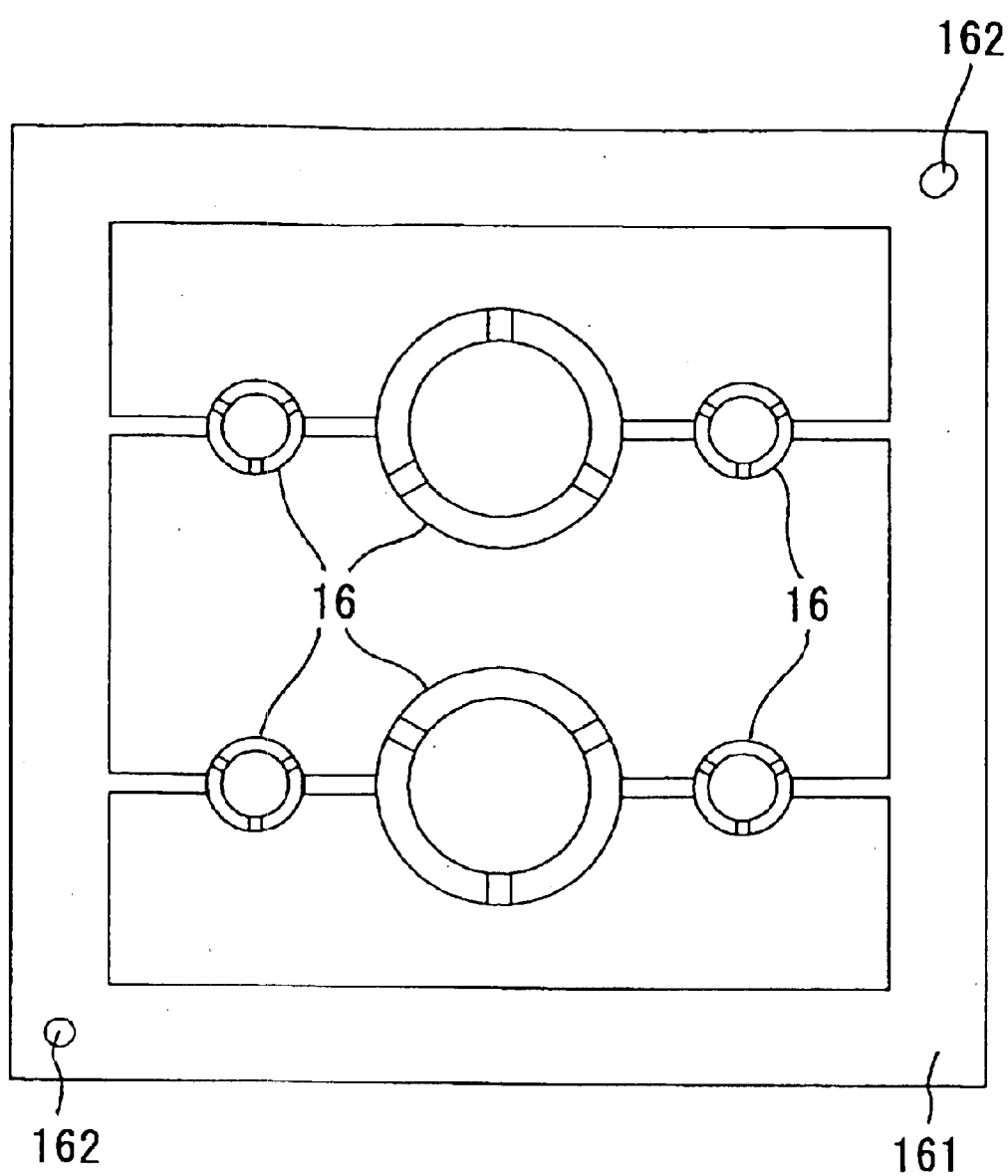
FIG. 13 shows a modification example of the moving body sheet.
Figure 14:
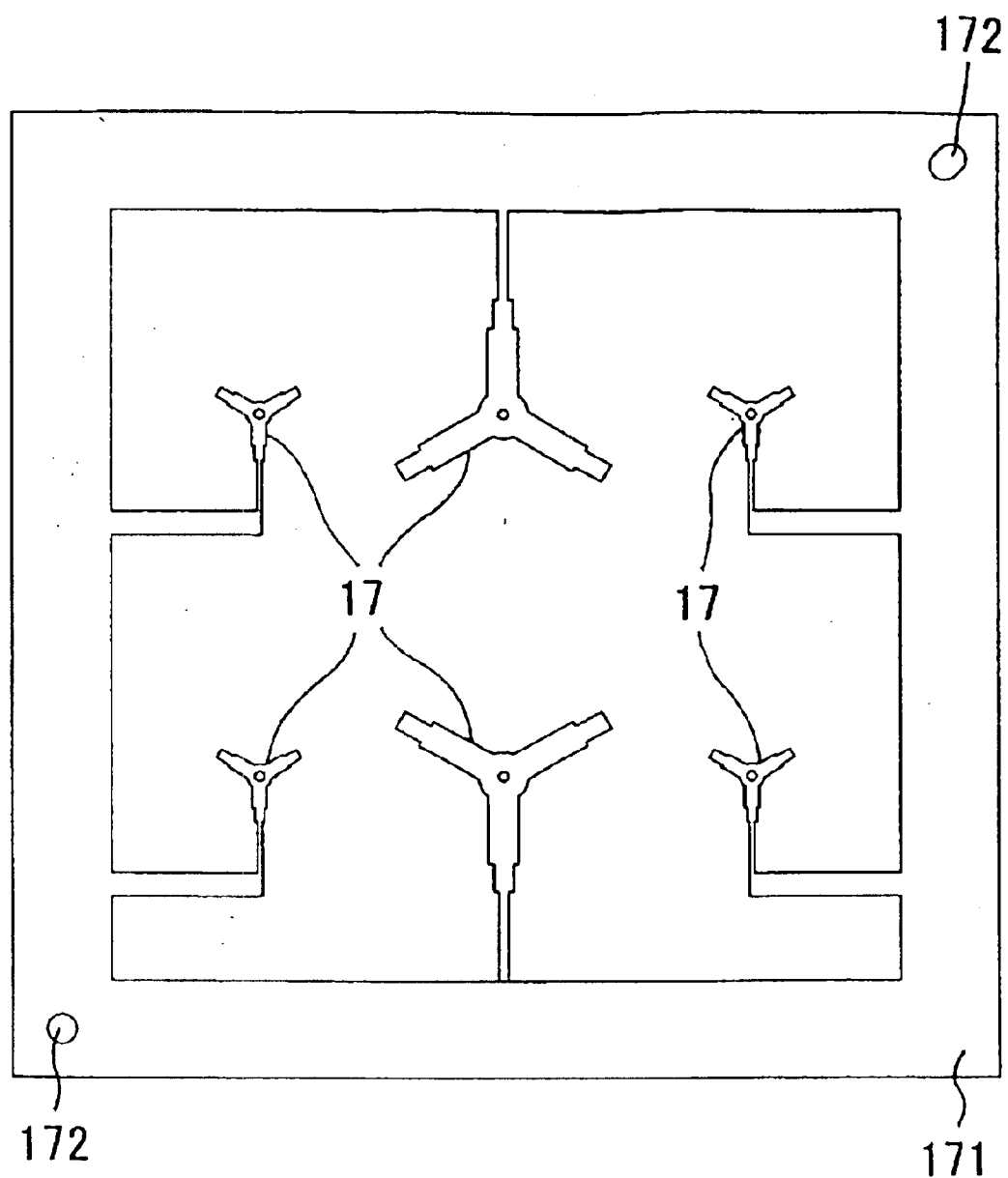
FIG. 14 shows a modification example of the pressuring mechanism sheet.

Note that, the various part sheets are not limited to those in this embodiment. As shown in FIG. 1, it is not required that all the regions 11b on the piezoelectric material sheet 111 have the same size, and the regions 11b may have different sizes In the case where the regions 11b have different sizes, as shown in FIG. 12, the vibrating bodies 14 of the vibrating body sheet 141 are formed with a shape corresponding to each of the regions 11b. Also, as shown in FIGS. 13 and 14, sizes and arrangements for the moving bodies 16 of the moving body sheet 161 and the pressuring mechanisms 17 of the pressuring mechanism sheet 171 are made corresponding to each of the regions 11b.

Further, concrete details with respect to the number of the regions 11b of the piezoelectric material sheet 111, electrode patterns formed on the piezoelectric material sheet 111, the protrusions 14a formed in the vibrating bodies 14 or the like can be changed.

Also, in this embodiment, although the piezoelectric actuators are manufactured in number order from step 51 to step S10, steps S1 to S9 to be executed may be exchanged each other to the extent possible, and step S10 may be executed last.

Also, dividing of the piezoelectric material sheet 111 (step S10) may be performed in a place where the piezoelectric actuator 1 is to be used. In this case, since the plurality of piezoelectric actuators before the dividing are packed for transportation, packing can be simplified and a manufacturing cost can be decreased. Also, since a quality examination before shipment can be performed for a plurality of products together, the quality examination becomes easy.

Also, before the dividing, leads (lines and FPC boards) for applying voltage signals may be attached to the electrode patterns 12 and 13 formed in each of the regions 11b of the piezoelectric material sheet 111 (not shown). In this case as well, working efficiency is improved.

Although in the described embodiment the piezoelectric bodies 11 and the vibrating bodies 14 each have a rectangular shape, these components may have instead a circular shape or the like.

According to the present invention, the number of steps can be greatly decreased in comparison with a conventional method of manufacturing piezoelectric actuators individually by performing various processings and joinings of various parts for each of the piezoelectric bodies divided As a result, production efficiency is improved and a manufacturing cost can be decreased.

Also, by joining various parts as part sheets, the number of steps can be further decreased, and miniaturization of the piezoelectric actuator can be sufficiently applied.

Also, when a piezoelectric material is transported to a place where the piezoelectric actuator is to be used and divided into the plurality of piezoelectric actuators to use them in the place, since the plurality of piezoelectric actuators before the dividing are packed together, packing can be simplified. Also, a manufacturing cost can be decreased. Further, a quality examination before shipment becomes easy.

Although a manufacturing method of the present invention has been described in detail, the present invention is not limited to the above embodiment, and various improvements and modifications may be naturally made in the scope not departing from the gist of the present invention.

What is claimed is:

1. A method of manufacturing a piezoelectric actuator, comprising the steps of:
   providing a piece of piezoelectric material having a plurality of piezoelectric bodies;
   providing a first piece of material having a plurality of vibrational bodies;
   providing a second piece of material having a plurality of movable bodies;
   providing a third piece of material having a plurality of pressurizing members;
   superimposing the first, second and third pieces of materials over the piece of piezoelectric material to form a multilayered structure having a plurality of piezoelectric actuators; and
   cutting the multilayered structure to separate each of the piezoelectric actuators from one another.

2. A method according to claim 1; wherein each of the piece of piezoelectric material, the first piece of material, the second piece of material, and the third piece of material comprises a sheet of material.

3. A method according to claim 1; wherein the step of providing the piece of piezoelectric material includes the steps of forming a dividing electrode pattern on a first main surface of the piece of piezoelectric material and forming a surface electrode pattern on a second main surface of the piece of piezoelectric material opposite the first main surface.

4. A method according to claim 3; wherein the piezoelectric bodies are formed on the first main surface of the piece of piezoelectric material.

5. A method according to claim 1; further comprising the step of transporting the multilayered structure prior to the cutting step to a preselected location in which the piezoelectric actuators are to be utilized; and wherein the cutting step is performed at the preselected location.

6. A method of manufacturing a piezoelectric actuator, comprising the steps of:
provinding a piece of piezoelectric material having a plurality of piezoelectric bodies;
forming electrode patterns on opposite main surfaces of the piece of piezoelectric material;
disposing on the piece of piezoelectric material a first piece of material having a plurality of vibrational bodies so that each of the vibrational bodies overlies respective ones of the piezoelectric bodies;
disposing on the first piece of material a second piece of material having a plurality of movable bodies so that each of the movable bodies overlies respective ones of the vibrational bodies;
disposing on the second piece of material a third piece of material having a plurality of pressurizing members so that each of the pressurizing members overlies respective ones of the movable bodies to thereby form a multilayered structure having a plurality of piezoelectric actuators; and
cutting the multilayered structure to separate each of the piezoelectric actuators from one another.

7. A method according to claim 6; wherein each of the piece of piezoelectric material, the first piece of material, the second piece of material, and the third piece of material comprises a sheet of material.

8. A method according to claim 6; further comprising the step of transporting the multilayered structure prior to the cutting step to a preselected location in which the piezoelectric actuators are to be utilized; and wherein the cutting step is performed at the preselected location.

9. A method according to claim 6; wherein the forming step comprises simultaneously forming the electrode patterns on the opposite main surfaces of the piece of piezoelectric material.

10. A method of manufacturing a piezoelectric actuator, comprising the steps of:
forming on a sheet of piezoelectric material a plurality of piezoelectric bodies each having a central hole;
forming on a first sheet of material a plurality of vibrational bodies each having a central hole and a pair of protrusions disposed symmetrically with respect to the central hole;
forming on a second sheet of material a plurality of movable bodies each having a central hole;
forming on a third sheet of material a plurality of pressurizing members each having a central hole;
disposing the first sheet of material on the sheet of piezoelectric material so that each of the vibrational bodies contacts respective ones of the piezoelectric bodies with the corresponding central holes being disposed in aligned relation;
connecting each of a plurality of support members with respective ones of the contacting vibrational bodies and piezoelectric bodies so that the support member extends through the aligned central holes of the overlapped vibrational body and piezoelectric body;
disposing the second sheet of material on the first sheet of material so that each of the movable bodies contacts the protrusions of respective ones of the vibrational bodies and so that each of the support members extends through the central hole of respective ones of the vibrational bodies;
disposing the third sheet of material on the second sheet of material so that each of the pressurizing members contacts respective ones of the movable bodies and so that each of the support members extends through the central hole of respective ones of the pressurizing members to thereby form a multilayered structure having a plurality of piezoelectric actuators; and
cutting the multilayered structure to separate each of the piezoelectric actuators from one another.

11. A method according to claim 10; further comprising the step of forming electrode patterns on opposite main surfaces of the sheet of piezoelectric material.

12. A method according to claim 11; wherein the step of forming the electrode patterns comprises simultaneously forming the electrode patterns on the opposite main surfaces of the sheet of piezoelectric material.

13. A method according to claim 11; wherein the step of forming the electrode patterns comprises forming a dividing electrode pattern on one of the main surfaces of the sheet of piezoelectric material and forming a surface electrode pattern on the other of the main surfaces of the sheet of material.

14. A method according to claim 13; wherein the piezoelectric bodies are formed on the main surface of the sheet of piezoelectric material on which the dividing electrode pattern is formed.

15. A method according to claim 10; further comprising the step of transporting the multilayered structure prior to the cutting step to a preselected location in which the piezoelectric actuators are to be utilized; and wherein the cutting step is performed at the preselected location.

* * * * *